United States Patent [19]

Bernardo et al.

[11] 4,161,817

[45] Jul. 24, 1979

[54] METHOD AND APPARATUS FOR MAKING A SEMICONDUCTOR DEVICE MOUNTING ELEMENT EMBODYING AN EMBEDDED FAN-OUT WIRE ARRANGEMENT

[75] Inventors: Edward T. Bernardo, Endicott; Louis H. Faure; Alfred H. Johnson, both of Poughkeepsie; Donald G. Pittwood, Owego, all of N.Y.

[73] Assignee: International Business Machines Corporation, Armonk, N.Y.

[21] Appl. No.: 892,048

[22] Filed: Mar. 31, 1978

[51] Int. Cl.$^2$ .............................................. H01R 9/00
[52] U.S. Cl. ................... 29/630 B; 264/285; 264/277; 264/328; 29/630 A; 29/33 F; 29/33 M; 29/755; 29/759; 264/261; 264/272
[58] Field of Search ............ 29/630 A, 630 B, 630 D, 29/628, 624, 629, 755, 759, 33 F, 33 M; 264/137, 261, 275, 277, 278, 272; 425/123; 140/92.1

[56] References Cited

U.S. PATENT DOCUMENTS 3,859,724  1/1975  Folkenroth ............................ 29/628

Primary Examiner—C. W. Lanham
Assistant Examiner—C. J. Arbes
Attorney, Agent, or Firm—Wolmar J. Stoffel

[57] ABSTRACT

A method of fabricating a semiconductor device mounting element embodying a wire fan-out wherein the ends of a plurality of insulated wires are supported in a spatial parallel arrangement of columns and rows between two spaced apertured die elements, the spacing of the wires is reduced at a first location between the die elements while maintaining the spatial arrangement of columns and rows, forming an enclosure about the wire portions positioned adjacent one of the die elements and the location where the spacing of the wires is reduced, injecting an organic hardenable resin material into the enclosure thereby encapsulating the wires positioned within, severing the wires, and removing the die.

An apparatus for fabricating a semiconductor device mounting element embodying a fan-out arrangement of embedded wires, the apparatus having a pair of die elements each die element provided with a plurality of apertures arranged in columns and rows and adapted in an operation to receive and position insulated wires, the apertures in the dies being in axial alignment, a first set of parallel spaced wires, a second set of spaced parallel wires position in transverse relation to the first set of wires, a means to support the first and second set of spaced wires in a first widely spaced relationship and in a second closely spaced relationship, and a means to support the die elements in the first closed position and in the second open position, a means to load a plurality of insulated wires through the apertures in the pairs of die elements, a means to support the pair of dies in the first closed position and move the dies to a second open position, a means to move the first and second sets of parallel space wires to the second closely spaced relationship to compress the wires, a retractable mold that surrounds portions of the insulated wires positioned between one of the die elements and the location where the wires are compressed, and a means to introduce a hardenable resin material into the enclosure to thereby encapsulate the enclosed wires.

11 Claims, 10 Drawing Figures

METHOD AND APPARATUS FOR MAKING A SEMICONDUCTOR DEVICE MOUNTING ELEMENT EMBODYING AN EMBEDDED FAN-OUT WIRE ARRANGEMENT

DESCRIPTION

Technical Field

This invention relates to a method and apparatus for producing a semiconductor device mounting element, and pertains more particularly to apparatus and method for positioning, assembling and embedding a plurality of elongated elements, such as wires, to form a mounting element provided with a fan-out of electrically conductive elements.

One object of the present invention is to provide an apparatus for assembling and positioning a plurality of wires in a spatial arrangement and subsequently embedding the wires in a dielectric material.

Another object of the invention is to provide a method of fabricating a semiconductor device mounting element wherein a plurality of wires are positioned and supported to form a fan-out arrangement and subsequently embedded in a dielectric material.

Another object of the present invention is to provide an apparatus for arranging and positioning a plurality of elongated elements whereby the spacing of the elements at one location can be accurately reduced.

Another object of the invention is to provide a method for reducing the spacing at an intermediate location of a plurality of wires arranged in columns and rows.

Still another object of this invention is to provide a method for forming a semiconductor device mounting element adapted to produce a very small microminiaturized arrangement of electrical terminals to match the pad terminals of the device.

BACKGROUND ART

In the semiconductor technology integrated circuit semiconductor devices are becoming increasingly more complex and microminiaturized. As the number of circuits on the device is increased there is a need for more I/O terminals. As the circuit density of the semiconductor device increases there is less space per I/O terminal on the device. Consequently, integrated circuit devices have more terminals, which are smaller in size. Presently devices have been produced which have over 100 I/O pads in the area of approximately ¼th square inch. Ultimately up to 600 I/O pads may be needed on a single device.

Such I/O terminal density on semiconductor devices presents formidable problems in semiconductor packaging technology. Flip-chip bonding techniques have the potential for forming the electrical connection between the device I/O pads and the corresponding pads on the supporting substrates at great pad densities. However, forming a fan-out electrical connection between the device terminal pads on the substrate and the substrate I/O terminals to the supporting board presents problems. The conventional single layer fan-out printed circuit pattern on substrate surfaces cannot be formed in the very small space provided to accomplish the de-densification of the substrate circuitry. One known technique for forming this necessary fan-out connection structure is using multi-layer ceramic technology. In this technology a plurality of green ceramic sheets are formed, holes punched, the holes filled with a conductive material, circuitry printed on the sheets, and the sheets assembled and sintered. In this manner the fan-out pattern is achieved by bringing it down into the substrate and dispersing it at various levels. However, this is a very complex and expensive technology.

Another technique is forming a plurality of metallurgy layers on the surface of the substrate where each layer is separated by a layer of dielectric material. However, this technique is limited since the lines very closely spaced in a vertical direction. Signals from various lines are induced into the adjacent lines during operation causing errors. Also, the area on the substrate package that is available to I/O pins or other type connections is limited.

Another potential solution to the de-densification problem in the packaging technology presented by a high density device is providing an intermediate element associated with the device that incorporates its own fan-out pattern arrangement of conductors.

This invention is related to this particular solution. In the fabrication of such a intermediate device mounting element very small wires must be accurately positioned and held during their encapsulation with a suitable dielectric material. In view of the very small size of the wires suitable for use in such elements, and the extreme precision required for positioning the wires no suitable apparatus was available prior to this invention for achieving this objective.

BRIEF DESCRIPTION OF THE DRAWINGS

In the accompanying drawings forming a material part of this disclosure.

DISCLOSURE OF THE INVENTION

For further comprehension of the invention, and of the objects and advantages thereof, reference will be had to the following description and accompanying drawings, and to the appended claims in which the various novel features of the invention are more particularly set forth.

Figure 1:
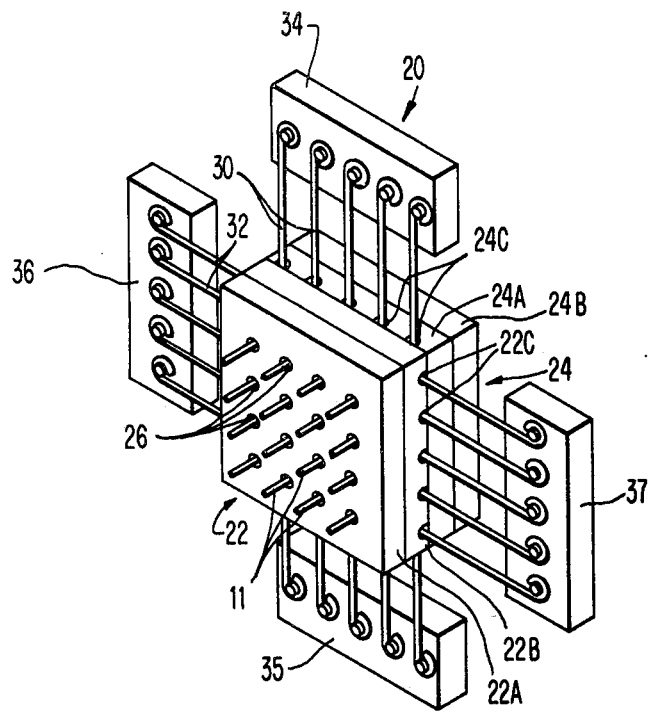
FIG. 1 is a perspective view of a portion of the apparatus of the invention which includes a set of mating die elements and a means to reduce the spacing of wires held by the dies.
Figure 9:
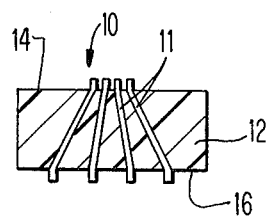
FIG. 9 is a sectional front view illustrating the semiconductor mounting element produced by the method of the invention on the apparatus of the invention.

Referring now to FIG. 1 there is depicted a preferred specific embodiment of the apparatus for fabricating a semiconductor device mounting element. The element 10 to be produced is shown in FIG. 9 and in general consists of a plurality of wires 11 embedded in a dielectric material 12 preferably a hardenable organic resin material. As indicated, the ends of wires 11 are closely spaced on the top surface 14 and arranged to correspond to the terminal pattern of a device to be mounted thereon. The wires 11 are arranged in a fan-out manner and protrude from the bottom surface 16 wherein the arrangement and spacing of the wire ends will correspond to a set of terminals on a mounting board or substrate not shown. The apparatus 20 for fabricating the semiconductor device mounting element has a pair of movable die elements 22 and 24 which are provided with a plurality of apertures 26 arranged in columns and rows as indicated in FIG. 1. The apertures 26 are aligned in dies 22 and 24 so that wires 11 can be inserted and forced through both dies by any suitable type of mechanism (not shown). The arrangement and spacing of the apertures 26 in dies 22 and 24 corresponds to the open wire spacing shown in FIG. 9 on the bottom side of the mounting element. Dies 22 and 24 can be split into two complementary sections 22A and B and also 24A and B which will permit shearing of the wires at a later stage of the process. Between the dies 22 and 24 are provided an apparatus for compressing the wires 11 thereby reducing the spacing of the wires at a central position. The wire compressor apparatus consists of a plurality of vertical wires 30 and a plurality of horizontal wires 32. Wires 30 are joined at their ends to crossbars 34 and 35. The horizontal wires 32 are pivotally joined to crossbars 36 and 37. The operation of the wire compressors will be explained in detail hereinafter.

On the two facing sides of dies 22 and 24 there are preferably provided grooves 22C and 24C to accommodate the wires 32 and 30 respectively. When the grooves 22C and 24C are provided the dies 22 and 24 can be positioned in close contacting relationship thereby facilitating the insertion of wires 11 through the dies.

It is to be understood that the number of apertures 26 in the dies 22 and 24 can greatly exceed the number illustrated in FIG. 1. The relatively small number of apertures and wires shown are adequate to illustrate the principle of the apparatus and the method. Also as more clearly shown in FIG. 2 the wires 32 are located between rows of wires 11. The wires 30 are positioned between the columns of wires 11. Also wires 11 which will be embedded in the semiconductor device mounting element are preferably insulated wires and most preferably coaxial wires.

Figure 2:
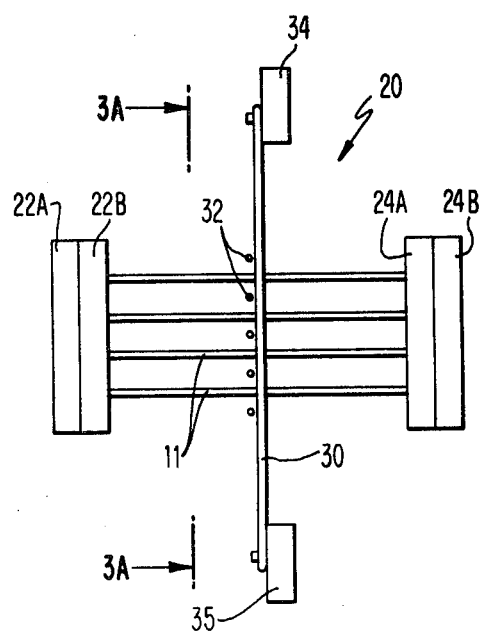
FIG. 2 is a side view of the die elements of the apparatus of the invention shown in spaced relation and with the parallel wire compressing mechanism in position to reduce the spacing between the wires held in the dies.
Figure 3A:
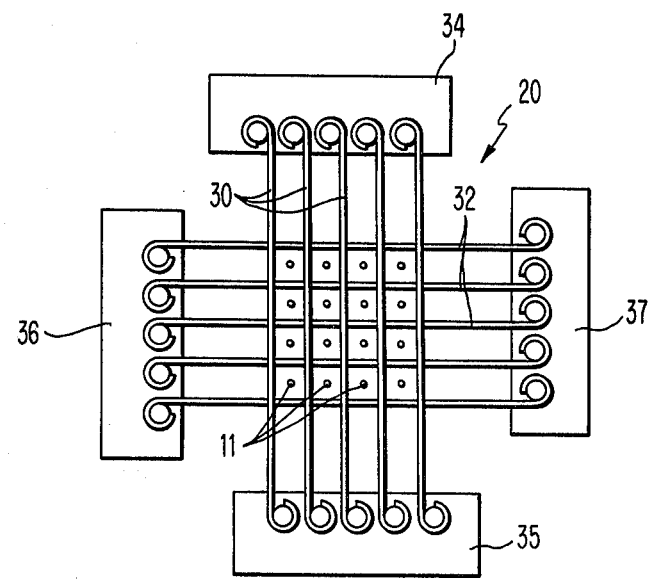
FIGS. 3A and 3B are front views of the parallel wire compressing mechanism for reducing the spacing of the wires positioned in the dies, with FIG. 3A taken on line 3A of FIG. 2 showing the parallel wire compressing arrangement in a spaced relation, and in FIG. 3B in position wherein the spacing of the wires positioned intermediate the dies are reduced.
Figure 3B:
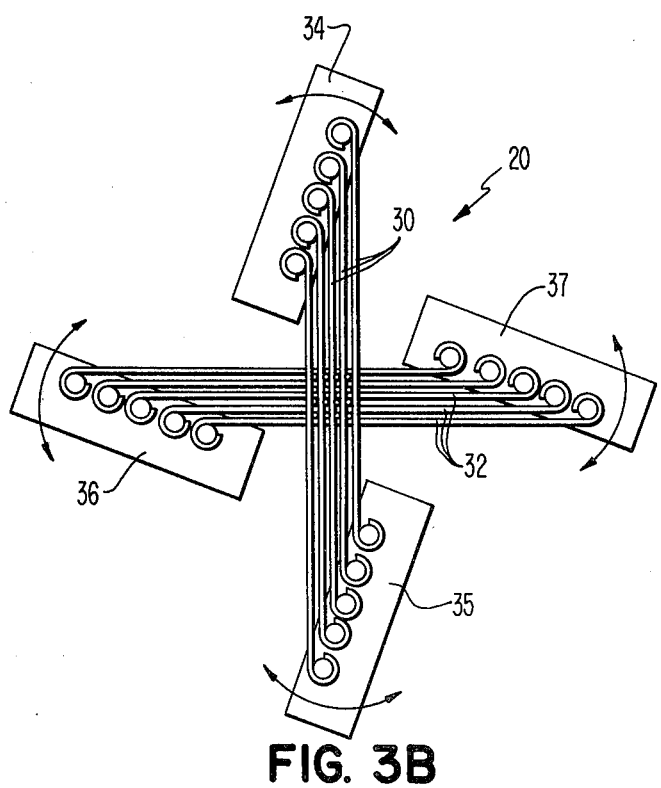
Figure 4:
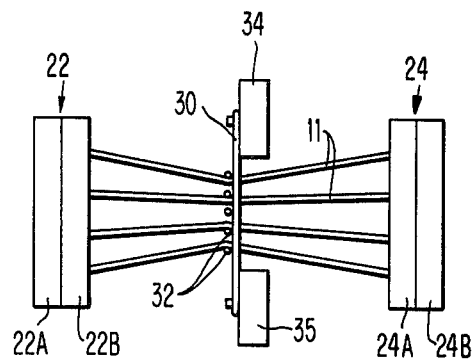
FIG. 4 is a side view of the die elements in spaced relation with the parallel wire compressing mechanism shown reducing the spacing of the wires held in the dies.

After the wires 11 have been inserted through the dies 22 and 24 the ends of the wires are secured in one of the dies, as for example displacing one of the die halves slightly with respect to the other, and the dies separated as indicated in FIG. 2. Wires 11 are allowed to slide through one of the dies to permit this spacing. The arrangement of the wires 30 and 32 with respect to wires 11 is shown most clearly in FIG. 3A. At this stage the spacing of wires 11 corresponds to the spacing and positioning of the apertures 26 in the dies. With the wires 30 and 32 located at an intermediate position between dies 22 and 24 the crossbars supporting wires 30 and 32 are pivoted as illustrated in FIG. 3B. As the crossbars are pivoted the spacing between wires 30 and wires 32 decreases uniformly and the wires 11 are thereby compressed to a much smaller spacing arrangement as illustrated in FIGS. 3B and 4.

Figure 5:
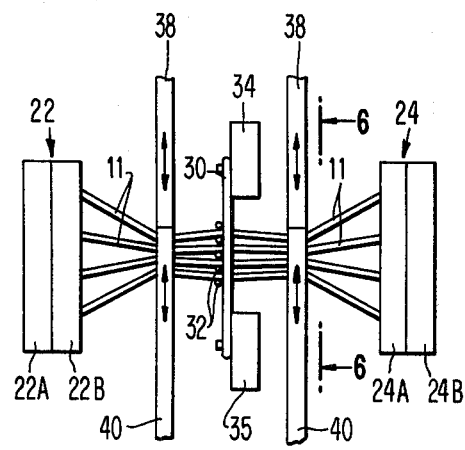
FIG. 5 is a side view illustrating the operation of the wire compacting mechanism for further reducing and compacting the plurality of wires supported in the dies.
Figure 6:
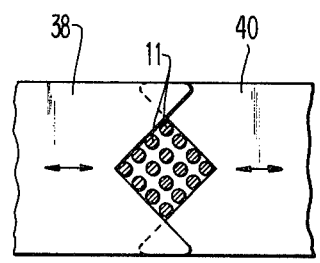
FIG. 6 is a front view in broken section illustrating the wire compacting mechanism for compacting the wires supported in the dies.

As shown in FIG. 5 sets of opposed wire compactors 38 and 40 compress wires 11 further at points between the dies and the previously described wire compressors. The wires 11 are compacted by a pair of jaws 38 and 40 which squeeze the wires 11 into contacting relation without disrupting the orderly column and row arrangement of the wires. As indicated in FIG. 6 the jaws 38 and 40 overlap slightly. It is desireable that a planar surface be presented on the side of the jaws facing the dies. This can be achieved by providing a lapped portion on the jaws 38 and 40 which when in abutting position presents a planar surface. Jaws 38 and 40 in addition to performing a compacting operation also serve as part of the mold which will be used to embed the wires 11.

Figure 7:
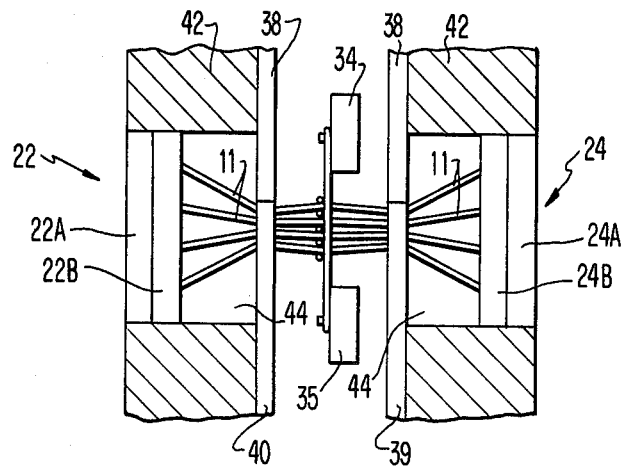
FIG. 7 is a side view in broken section illustrating the mold surrounding the plurality of compacted wires supported between the dies.
Figure 8:
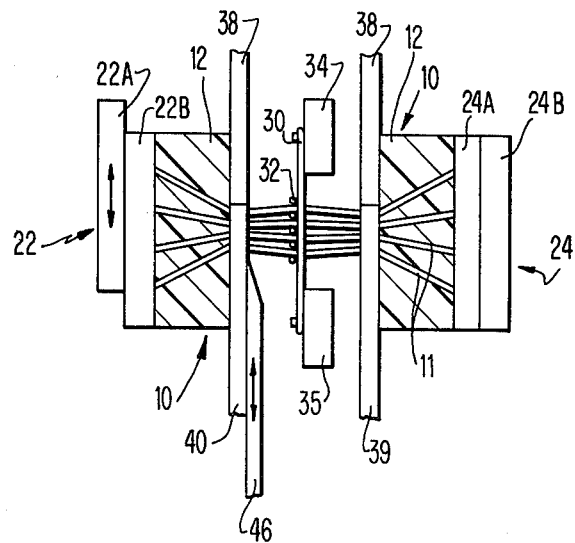
FIG. 8 is a sectional side view which illustrates the shearing of the embedded wires supported in the dies after the molding operation has been complete.

As indicated in FIG. 7 a mold 42 is moved into position relative to dies 22 and 24 and the compactor jaws 38 and 40 to define a mold cavity 44. The structure of the molds and their inneraction with the die elements is not disclosed in detail. However any person skilled in the art could design a suitable mold to achieve this function. Dielectric material is then forced into the mold cavity 44 and allowed to harden thereby encapsulating the wires 11. After the dielectric material has hardened the ends of the wires 11 are sheared as indicated in the FIG. 8 by moving die portions 22A and 24A relative to die portions 22B and 24B. The wires on the opposite side of the semiconductor mounting element are sheared with a blade 46.

After the semiconductor elements have been removed from the die, the insulation covering the ends of wires 11 which protrude from the element should be removed. This can be conveniently achieved by exposing the wires to a suitable solvent which dissolves the insulating material.

While we have illustrated and described the preferred embodiments of the invention it is to be understood that we do not limit ourselves to the precise construction herein disclosed and the right is reserved to all changes and modifications coming within the scope of the invention as defined in the appended claims.

Having thus described our invention, what we claim as new, and desire to secure by Letters Patent is:

1. A method of fabricating a semiconductor device mounting element for providing a fan-out I/O terminal attachment comprising,
    supporting a plurality of insulated wires in a spatial parallel arrangement of columns and rows between two spaced apertured flat die elements,
    engaging said wires at a first location between said die elements and uniformly reducing the spacing in a first direction between the wires at only a first location maintaining the an arrangement of columns and rows,
    compacting said wires in a direction transverse to said first direction at a second location adjacent the said first location while maintaining an arrangement of columns and rows, forming an enclosure about the wire portions positioned between one of said die elements and said second location, injecting an organic hardenable resin material into said enclosure thereby encapsulating the wires positioned within, severing the wires adjacent said second location, and severing the wires adjacent said die element, and removing the die.

2. The method of claim 1 wherein said insulated wires are coax cable wires.

3. The method of claim 1 of forming two device mounting elements wherein the wires are compacted at two second locations, on both sides of said first location, and two enclosures are formed, each positioned about wire portions positioned between the die element and the second location.

4. The method of claim 1 wherein the wires supported in the dies are compacted by contact at the first location with a first set of parallel wires, and contact by a second set of parallel wires positioned transverse to the first set of wires, and subsequently the distances between the first and second sets of wires are reduced.

5. An apparatus for fabricating a semiconductor device mounting element providing a wire fan-out I/O terminal attachment comprising a pair of die elements provided with facing flat surfaces, each die element provided with a plurality of apertures, arranged in columns and rows and adapted in operation to receive and position insulated wires, said apertures in said die elements being in axial alignment, a first set of parallel spaced wires located between said die elements, a second set of spaced parallel wires located between said die elements and positioned transverse to said first set of parallel spaced wires, means to support said first set and said second set of spaced wires in a first widely spaced relationship, and in a second closely spaced relationship, support means for said die elements to support said die elements in a first closed position, and a second open position, a means to load a plurality of insulated wires through said apertures in said pair of die elements when said die elements are in said first closed position, a means to move said pair of dies from said first closed position to said second open position, a means to move said first and second sets of parallel spaced wires to said second closely spaced relationship, a compactor means located between said die elements, when in said second open position, and said first and second sets of spaced wires to compress the insulated wires supported between said die elements into close relation while maintaining the column and row orientations of the insulated wires, a retractable mold that surrounds the portions of insulated wires positioned between one of said die elements and a compactor means, a means to introduce a hardenable resin material into said enclosure to thereby encapsulate the enclosed wires, and a means to sever the plurality of wires adjacent said compactor means.

6. The apparatus of claim 6 wherein:

one of said dies has a first set of grooves on said facing flat surface adapted to receive said first set of parallel spaced wires, and the other of said dies has a second set of grooves on said facing flat surface adapted to receive said second set of parallel wires, said grooves in use adapted to permit abutting of said facing flat surfaces of said die elements during loading of said plurality of insulated wires.

7. The apparatus of claim 6 wherein said compactor means is comprised of a pair of opposed jaws provided with wire engaging surfaces positioned at 45° relative to the path of movement of said jaws.

8. The apparatus of claim 6 wherein said means to support said first and second set of spaced wires is comprised of cross bars at the ends of each set of parallel wires, means to pivotally attach each wire to said cross bars, and means to pivotally support each cross bar.

9. The apparatus of claim 5 wherein each of said die elements is comprised of two apertured plates.

10. The apparatus of claim 9 wherein a means to sever the plurality of wires supported in said dies is comprised of a means to move said aperture plates relative to each other thereby producing a shearing action.

11. The apparatus of claim 7 wherein said means to sever the plurality of wires adjacent said compactor means is a blade that is moved over the surface of said pair of opposed jaws.

* * * * *